United States Patent [19]
Bird et al.

[11] Patent Number: 5,150,787
[45] Date of Patent: Sep. 29, 1992

[54] COMPONENT CARRIER TAPE

[75] Inventors: Gerald C. Bird, Woodbury; Paul E. Hansen, Lake Elmo, both of Minn.

[73] Assignee: Minnesota Mining and Manufacturing Company, St. Paul, Minn.

[21] Appl. No.: 659,028

[22] Filed: Feb. 21, 1991

[51] Int. Cl.⁵ .................. B65D 73/02; B65D 75/34; B65D 85/30
[52] U.S. Cl. .................. 206/329; 156/252; 156/254; 206/524.6; 428/134; 428/138; 428/219; 428/220; 428/286; 428/287; 428/288; 428/311.5; 428/339; 428/340; 428/906
[58] Field of Search .......... 428/134, 138, 286, 287, 428/311.5, 339, 340, 906; 206/329, 524.6

[56] References Cited
U.S. PATENT DOCUMENTS

| | | | |
|---|---|---|---|
| 4,042,740 | 8/1977 | Krueger | 428/138 |
| 4,103,058 | 7/1978 | Humlicek | 428/171 |
| 4,298,120 | 11/1981 | Kaneko et al. | 206/329 |
| 4,657,137 | 4/1987 | Johnson | 206/329 |
| 4,681,801 | 7/1987 | Eian et al. | 428/283 |
| 4,736,841 | 4/1988 | Kaneko et al. | 206/332 |
| 4,760,916 | 8/1988 | Kaneko et al. | 206/329 |

Primary Examiner—James C. Cannon
Attorney, Agent, or Firm—Gary L. Griswold; Walter N. Kirn; William L. Huebsch

[57] ABSTRACT

A carrier tape comprising a strip of flexible material having a series of spaced through openings and a predetermined thickness, the size of the openings and the predetermined thickness being adapted to receive a component between the major surfaces of said strip. The strip of flexible material comprises a layer of nonwoven thermoplastic polymeric fiber adhered together and has in the range of 20 to 70 percent air filled open spaces between the fibers.

8 Claims, 2 Drawing Sheets

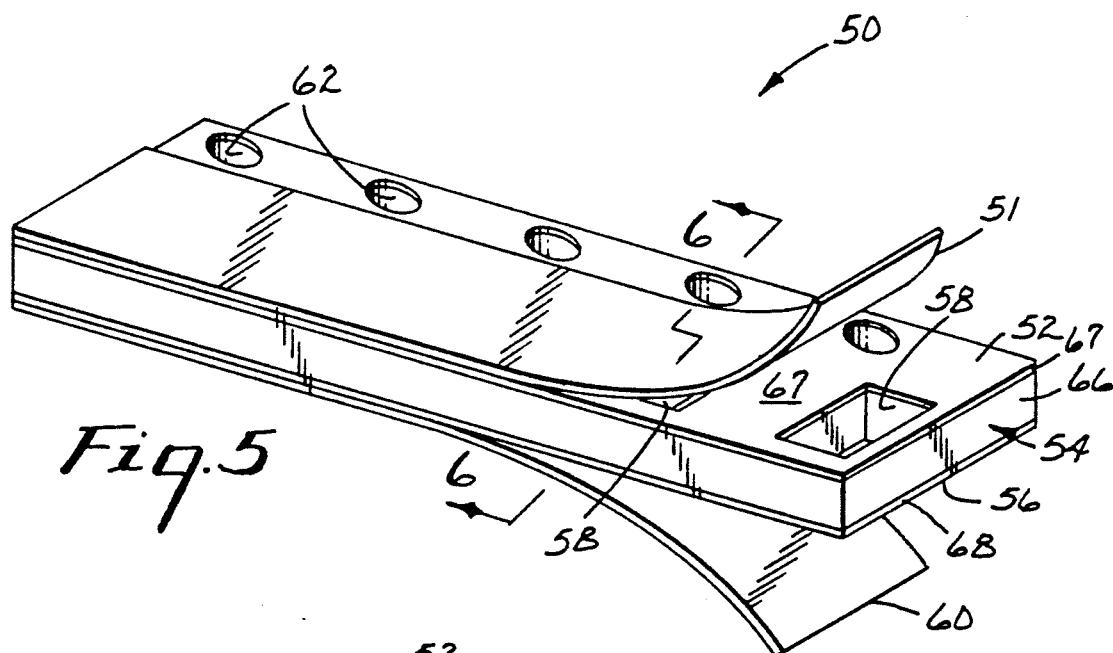
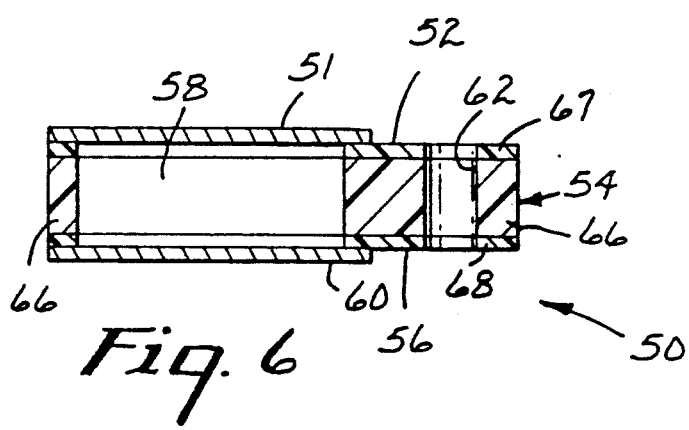

COMPONENT CARRIER TAPE

TECHNICAL FIELD

The present invention relates to surface mount supplies carrier tape of the type used to transport components from a component manufacturer to a different manufacturer or assembler that assembles the components into circuits.

BACKGROUND

Surface mount supplies carrier tape is used to transport components (e.g., electrical components such as resistors, capacitors, or integrated circuits) from a component manufacturer to a different manufacturer or assembler that assembles the components into new products such as into circuit boards, typically by having automated assembly equipment sequentially remove components from the carrier tape and assemble them into the new products. Such carrier tape is a strip of material that has a series of identical pockets at predetermined uniformly spaced intervals along its length, which pockets are shaped to closely receive components the tape is adapted to transport (e.g., which pockets could, for example, have rectangular or generally "I" or "T" shapes in the plane of the strip). The strip normally also has through openings uniformly spaced along one side to receive a drive sprocket by which the strip can be driven and to provide indexing holes that can be used for accurately locating the pockets along the tape with respect to assembly equipment. Typically, the carrier tape is manufactured in a first manufacturing location, wound on a reel and transported to the supplier of the components it is intended to transport. The component supplier unwinds the carrier tape from the reel, fills the pockets along the carrier tape with components, adheres a removable cover strip along the carrier tape over the component filled pockets, winds the component filled carrier tape with the attached cover strip onto a reel, and sends it to the component assembler who feeds it from the reel into the assembly equipment which removes the components.

One common type of such carrier tape called embossed carrier tape, illustrated in U.S. Pat. No. 4,736,841, is typically formed from an initially flat polymeric heated thermoplastic strip using a tool to deform portions of the strip and form the pockets (e.g., male and female die sets, or a male or a female die over which the strip is vacuum formed).

A less expensive type of such carrier tape called flat punched carrier tape, illustrated in U.S. Pat. Nos. 4,298,120 and 4,657,137, is typically formed by die punching a series of openings of a desired shape for the pockets through a strip slit from a sheet of material having a thickness corresponding to the depth of the pockets to be formed, and adhering a bottom strip along one side of the punched strip to form the bottoms for the pockets.

Most strips of material used in such carrier tapes are of paper. Fine dust particles generated during slitting and punching of paper are carried by the carrier tape and deposited on the automated assembly equipment and new products of the component assembler which can cause product quality problems. Paper has many fillers which are very abrasive to die punch tools, resulting in accelerated wear of the die and poor quality punching. Also, because of problems with delamination of layers within such paper strips, the thickness of the paper strips used in such carrier tape has been limited to about 1 millimeter (0.04 inch), which limits the size of the components that can be packaged in the carrier strip.

Strips of material used in such carrier tapes have also been made of polymeric materials which produce no dust when slit or punched. Such polymeric materials are typically filled with fillers to reduce their cost and improve the bond between existing cover tapes and the surface of such carrier tapes, which fillers make them stiffer than is desired and abrasive to die punch tools, while still being more expensive than carrier tape made with strips of paper material.

Other materials have also been suggested for the strips of material used in such carrier tapes, such as metal foils and rubber (see U.S. Pat. No. 4,298,120) and laminated polymeric foams (see U.S. Pat. No. 4,657,137); however, none has a combination of properties that provides a commercially acceptable solution to the problems discussed above.

DISCLOSURE OF INVENTION

The present invention provides a carrier tape of the type described above comprising a strip of flexible material, a series of spaced openings through the strip extending between its top and bottom major surfaces, the size of the openings along its major surfaces and its thickness being adapted to receive a component between the major surfaces of the strip; which carrier tape is improved in that the strip of flexible material comprises a layer of nonwoven thermoplastic polymeric fibers (e.g., fibers of polypropylene and polyethylene, or polypropylene and a copolymer of polypropylene) adhered together at their crossover points, with the strip of flexible material having in the range of 20 to 70 percent (and preferably 45 to 50 percent) air filled open spaces between the fibers.

Generally, the strip of flexible material is formed by (1) forming a nonwoven mat having a predetermined weight per unit area of thermoplastic polymeric fibers; (2) heating and compressing the nonwoven mat to adhere the fibers together and form a flexible sheet having flat generally parallel top and bottom major surfaces, a predetermined thickness between its top and bottom surfaces that is less than the original thickness of the mat, and having in the range of 20 to 70 percent air filled open spaces between the fibers; (3) slitting the sheet to form at least one strip; and (4) punching the strip to form the series of spaced openings extending between its major surfaces.

Such a strip of flexible material, while being slightly more expensive than paper, is lower in cost than the other polymeric materials described above, is dust free, and needs no fillers that can stiffen the strip or cause accelerated wear of the punching equipment; although fillers such as desiccants, conductive agents, humidicants, or adhesion modifiers can be added as desired or needed for specific applications. Also, proper selection of polymer blends for use as the fibers (e.g. polypropylene and polyethylene or polypropylene and copolymers of polypropylene) allow conventional cover tapes to bond sufficiently well to the major surfaces of the strip of flexible material to meet industry standards for such bonding. The strip of flexible material is very flexible when made up to 1 millimeter (0.04 inch) thick, and can be made as thick as 2.5 millimeters (0.1 inch) without being too stiff to use so that carrier tape made from it can be used to package larger components than many of the prior art carrier tapes described above.

In one embodiment of the carrier tape according to the present invention the strip of flexible material consists only of the layer of blown microfibers that are of about 75 percent polypropylene and about 25 percent polyethylene which provides a strip of flexible material for carrier tape that punches easily and meets existing industry standards for adhesion to its surfaces by conventional bottom and cover tapes.

In another embodiment of the carrier tape according to the present invention the strip of flexible material comprises a layer of blown microfibers that are of about 75 percent polypropylene and about 25 percent polyethylene and a relatively much thinner reinforcing layer (e.g., of a polypropylene film, or a spunbonded polypropylene nonwoven) adhered to one or both surfaces of the layer of blown microfibers to both increase the breaking strength of the carrier tape which may be necessary for use of the carrier tape with some carrier tape machines, and provide a surface that conventional bottom and cover tapes may be securely adhered to.

BRIEF DESCRIPTION OF DRAWING

The present invention will be further described with reference to the accompanying drawing wherein like reference numerals refer to like parts in the several views, and wherein:

FIG. 5 is a perspective view of a second embodiment of a short length of carrier tape according to the present invention having a cover tape adhered thereto, and having end portions separated to show details of the cover tape and of a strip of flexible material and a bottom tape included in the carrier tape; and FIG. 6 is an enlarged cross sectional view taken approximately along line 6—6 of FIG. 5.

DETAILED DESCRIPTION

Figure 1:
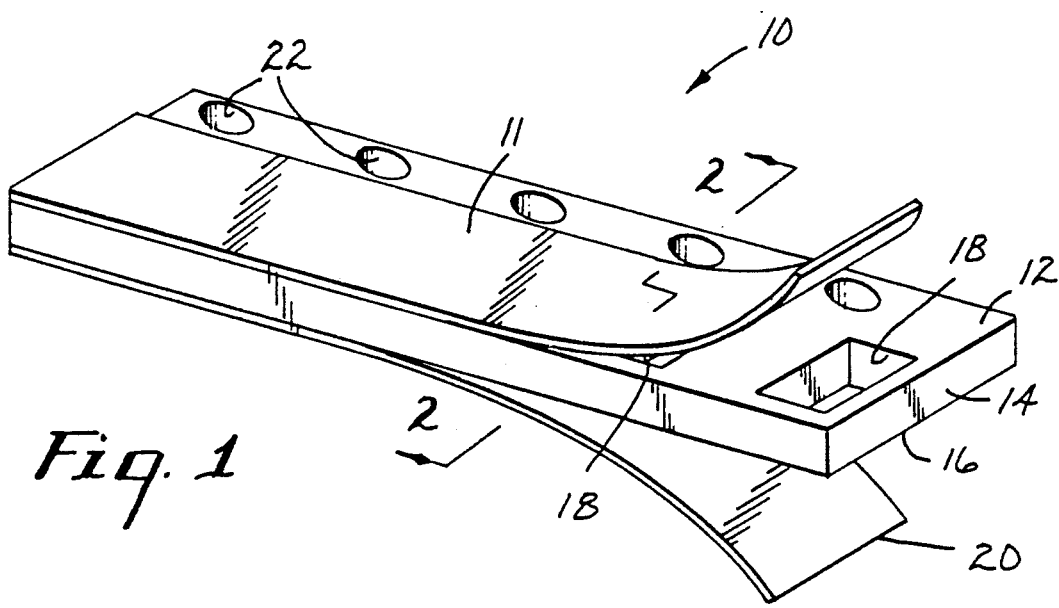
FIG. 1 is a perspective view of a short length of carrier tape according to the present invention having a cover tape adhered thereto, and having end portions separated to show details of the cover tape and of a strip of flexible material and a bottom tape included in the carrier tape.

Referring now to the drawing, there is shown a first embodiment of a carrier tape according to the present invention generally designated by the reference numeral 10 having a cover tape 11 adhered along a top surface 12 thereof.

Generally the carrier tape 10 comprises a strip of flexible material 14 having a top major surface that provides the top surface 12 of the carrier tape 10, an opposite bottom major surface 16, a series of spaced through rectangular openings 18 between its major surfaces 12 and 16, and a predetermined thickness between its major surfaces 12 and 16. The size and shape of the openings 18 along its major surfaces 12 and 16 and the predetermined thickness of the strip of flexible material 14 are adapted to receive a component (not shown) within each opening 18 between its major surfaces 12 and 16. Also, the carrier tape 10 includes a bottom tape or strip 20 adhered by a layer of a suitable adhesive (not shown) along the bottom surface 16 of the strip of flexible material 14 to form bottom walls across the openings 18 and, with the surfaces defining the openings 18, to define pockets in which the components will be retained. The strip of flexible material 14 also has a series of through, equally spaced, cylindrical openings 22 along one side to receive a drive sprocket by which the carrier tape 10 can be driven and to provide indexing openings that can be used for accurately locating the pockets along the carrier tape 10 with respect to assembly equipment in which the carrier tape 10 is intended to be used.

The general carrier tape structure described in the preceding paragraph is well known where the strip of flexible material is of paper or a filled plastic material. Unlike those prior art structures, however, in the carrier strip 10 according to the present invention the strip 14 of flexible material consists of a layer of nonwoven thermoplastic polymeric fibers which are adhered together at a substantial number of their crossover points and has in the range of 20 to 70 percent air filled open spaces between the fibers that provides the advantages described above. By "substantial number" we mean a number (typically over 50 percent but less than 100 percent of the crossover points) that will maintain the structural integrity of the strip 14 durring its use in the carrier tape 10.

Figure 3:
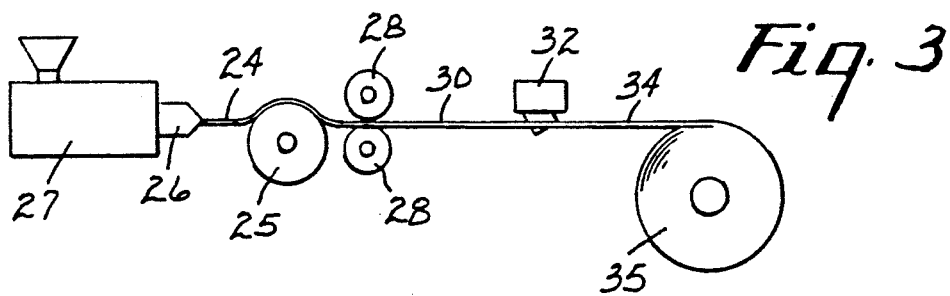
FIG. 3 is a schematic view illustrating a first portion of a method according to the present invention for making the strip of flexible material included in the carrier tape of FIGS. 1 and 2.

FIG. 3 schematically illustrates a first portion of a method according to the present invention for making the strip 14 of flexible material. As illustrated, a mat 24 of nonwoven blown microfibers of a polymeric material is formed on the periphery of a cylindrical collector 25 in a known manner by extruding the microfibers from a die 26 fed by an extruder 27, however, a similar mat of nonwoven thermoplastic polymeric fibers could be formed by other known methods such as by the use of a Rando webber, or carding, or wet laid equipment. The mat 24 of nonwoven fibers thus formed is heated and compressed in a nip between a pair of heated (e.g., at 200 degrees Fahrenheit) cylindrical rollers 28 to form a flexible sheet 30 having flat top and bottom surfaces, having a predetermined thickness between its top and bottom surfaces that is less than the thickness of the mat 42 and is determined by the spacing at the nip between the rollers 28, and having in the range of 20 to 70 percent air filled open spaces between the fibers. The flexible sheet 30 is then slit by a conventional slitting equipment 32 to form at least one and preferably a plurality of strips (only one strip 34 being shown), which strip 34 can, as illustrated, be helically rolled around the hub of a reel to form a supply roll 35 of the strip 34.

Figure 2:
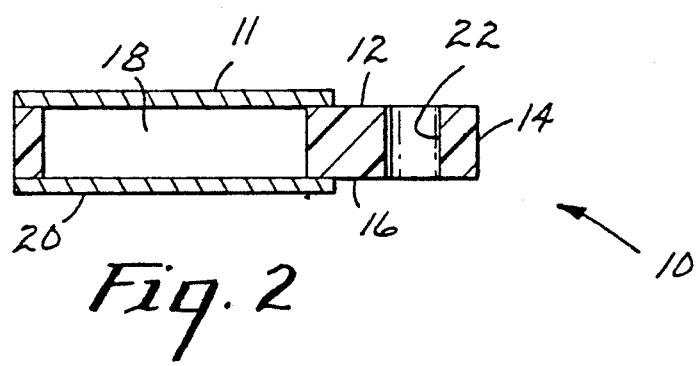
FIG. 2 is an enlarged cross sectional view taken approximately along line 2—2 of FIG. 1.
Figure 4:
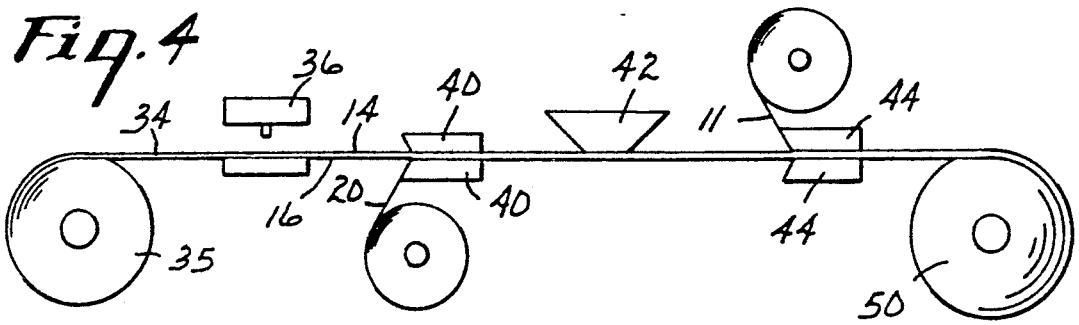
FIG. 4 is a schematic view illustrating a second portion of the method according to the present invention for making the strip of flexible material included in the carrier tape illustrated in FIGS. 1 and 2, for applying the bottom tape to the strip of flexible material, and for filling the carrier tape with components and applying the cover tape thereto.

A second portion of the method according to the present invention for making the strip 14 of flexible material is illustrated in FIG. 4. The strip 34 from the supply roll 35 is unwound and punched using conventional punching equipment 36 to form the strip of flexible material 14 incorporated in the carrier tape 10 with its series of spaced rectangular openings 18 and cylindrical openings 22 that are illustrated in FIGS. 1 and 2. The bottom strip 20 is then applied to the bottom surface 16 of the strip of flexible material 14 as it passes between a pair of heated platens 40 to provide the bottom walls across the openings 18 and, with the surfaces defining the openings 18, defining pockets along the carrier tape 10. The pockets along the carrier tape 10 are sequentially filled with components as the carrier tape 10 passes beneath a component filling device 42, after which the cover tape 11 is applied between a pair of heated platens 44 to the top surface 12 of the strip of flexible material 14, and the component filled and covered carrier tape 10 is wound on a reel 50 ready to be shipped to an assembler who will assemble the components into his products using automated assembling equipment.

The first portion of the method illustrated in FIG. 3 can be performed by one manufacturer who manufacturers the strip 34, and the second portion of the method illustrated in FIG. 4 can be performed by the supplier of the components. Alternatively, The first portion of the method illustrated in FIG. 3 together with the punching and the application of the bottom strip 20 illustrated in FIG. 4 can be performed by the manufacturer who manufacturers the strip 34, whereupon only the filling of the pockets with components and the application of the cover tape 11 will be done by the supplier of the components.

Using the method described above, virtually any type of thermoplastic polymeric material which can be extruded can be used to make the fibers from which the strip of flexible material 14 is made. Of the thermoplastic polymeric materials that have been tested, polypropylene and polyesters or their copolymer blends provide the best strips of flexible material 14, with the best embodiment being of polypropylene, having about 40 to 50 percent air filled open spaces between the fibers, and having an average weight of about 400 grams per square meter at a thickness between its major surfaces of about 0.09 centimeter (0.035 inches).

The maximum thickness of the strips of flexible material 14 that can be made are somewhat limited by the ability to adhere the fibers together along the central portions of the nonwoven strips of flexible material 14 (i.e., about half way between their major surfaces 12 and 16) by the transfer of heat through the fibers from the heated rollers 28. Using fibers coextruded of polypropylene and a low melting temperature copolyester should result in adhering together of fibers in that central portion with less heat input due to the ability of the copolyester to melt and adhere the fibers together with relatively low heat input, thus allowing even thicker strips of flexible nonwoven material 14 to be manufactured using the same heated rolls 28 and heat input to the fibers.

FIGS. 5 and 6 of the drawing illustrate a second embodiment of a carrier tape according to the present invention generally designated by the reference numeral 50 having a cover tape 51 adhered along a top surface 52 thereof.

Generally, like the carrier tape 10, the carrier tape 50 comprises a strip of flexible material 54 having a top major surface that provides the top surface 52 of the carrier tape 50, an opposite bottom major surface 56, a series of spaced through rectangular openings 58 between its major surfaces 52 and 56, and a predetermined thickness between its major surfaces 52 and 56. The size and shape of the openings 58 along its major surfaces 52 and 56 and the predetermined thickness of the strip of flexible material 54 are adapted to receive a component (not shown) within each opening 58 between its major surfaces 52 and 56. Also, the carrier tape 50 includes a bottom tape or strip 60 adhered by a layer of a suitable adhesive (not shown) along the bottom surface 56 of the strip of flexible material 54 to form bottom walls across the openings 58 and, with the surfaces defining the openings 58, to define pockets in which the components will be retained. The strip of flexible material 54 also has a series of through, equally spaced, cylindrical openings 62 along one side to receive a drive sprocket by which the carrier tape 50 can be driven and to provide indexing openings that can be used for accurately locating the pockets along the carrier tape 50 with respect to assembly equipment in which the carrier tape 50 is intended to be used.

Unlike the carrier tape 10, in the carrier strip 50 the strip 54 of flexible material includes both a layer 66 of nonwoven thermoplastic polymeric fibers adhered together at a substantial number of their crossover points and having in the range of 20 to 70 percent air filled open spaces between the fibers that provides the advantages described above, and two relatively much thinner reinforcing layers 67 and 68 (e.g., of a polypropylene film, or a spunbonded polypropylene nonwoven) adhered to both surfaces of the layer 66 of fibers to both increase the breaking strength of the carrier tape 50 which may be necessary for use of the carrier tape 50 with some carrier tape machines; and provide the major surfaces 52 and 56 for the strip 54 of flexible material to which conventional bottom and cover tapes 60 and 51 may be securely adhered.

The present invention has now been described with reference to two embodiments thereof. It will be apparent to those skilled in the art that many changes can be made in the embodiments described without departing from the scope of the present invention. Thus the scope of the present invention should not be limited to the structures described in this application, but only by structures described by the language of the claims and the equivalents of those structures.

We claim:

1. In a carrier tape comprising a strip of flexible material having top and bottom major surfaces, a series of spaced openings through the strip of flexible material extending between said major surfaces, and a predetermined thickness between said major surfaces, the size of said openings along said major surfaces and said predetermined thickness being adapted to receive a component between the major surfaces of said strip of flexible material, the improvement wherein the strip of flexible material comprises a layer of nonwoven thermoplastic polymeric fibers, said fibers being adhered together at a substantial number of the fiber crossover points, and said layer of nonwoven thermoplastic polymeric fibers having in the range of 20 to 70 percent air filled open spaces between the fibers.

2. A carrier tape according to claim 1 wherein said fibers are blown microfibers of polypropylene and polyethylene.

3. A carrier tape according to claim 1 wherein said fibers are blown microfibers of about 75 percent polypropylene and about 25 percent polyethylene.

4. A carrier tape according to claim 1 wherein said fibers are blown microfibers of about 75 percent polypropylene and about 25 percent polyethylene, and said strip of flexible material consists only of said layer of nonwoven thermoplastic polymeric fibers and has an average weight of about 400 grams per square meter and an average thickness between said major surfaces of about 0.09 centimeter (0.035 inch).

5. A carrier tape according to claim 1 wherein said layer of thermoplastic polymeric fibers has in the range of 45 to 50 percent air filled open spaces between the fibers.

6. A carrier tape according to claim 1 wherein said strip of flexible material is in the range of about 0.2 to 2.5 millimeter thick between said major surfaces.

7. A carrier tape according to claim 1 wherein said strip of flexible material further includes one strong reinforcing sheet adhered along one surface of said layer of nonwoven thermoplastic polymeric fibers, said reinforcing sheet being relatively thin compared to said layer of nonwoven thermoplastic material and defining one of said major surfaces of said strip of flexible material.

8. A carrier tape according to claim 1 wherein said strip of flexible material further includes two strong reinforcing sheets adhered along opposite surfaces of said layer of nonwoven thermoplastic polymeric fibers, said reinforcing sheets being relatively thin compared to said layer of nonwoven thermoplastic material and defining said major surfaces of said strip of flexible material.

* * * * *